United States Patent [19]

Stalder et al.

[11] Patent Number: 5,486,697

[45] Date of Patent: Jan. 23, 1996

[54] ARRAY OF MICRO-MACHINED MASS ENERGY MICRO-FILTERS FOR CHARGED PARTICLES

[75] Inventors: Roland E. Stalder, Pasadena; Thomas R. Van Zandt, Redondo Beach; Michael H. Hecht, Los Angeles; Frank J. Grunthaner, Glendale, all of Calif.

[73] Assignee: California Institute of Technology, Pasadena, Calif.

[21] Appl. No.: 338,400

[22] Filed: Nov. 14, 1994

[51] Int. Cl.⁶ .................................................. H01J 37/12
[52] U.S. Cl. .................................. 250/305; 250/396 R
[58] Field of Search .............................. 250/305, 396 R, 250/396 ML

[56] References Cited

U.S. PATENT DOCUMENTS 5,214,289   5/1993   Betsui ................................. 250/396 R

*Primary Examiner*—Jack I. Berman
*Assistant Examiner*—Kiet T. Nguyen
*Attorney, Agent, or Firm*—Robert M. Wallace; Michael L. Keller

[57] ABSTRACT

An energy filter for charged particles includes a stack of micro-machined wafers including plural apertures passing through the stack of wafers, focusing electrodes bounding charged particle paths through the apertures, an entrance orifice to each of the plural apertures and an exit orifice from each of the plural apertures and apparatus for biasing the focusing electrodes with an electrostatic potential corresponding to an energy pass band of the filter.

18 Claims, 6 Drawing Sheets

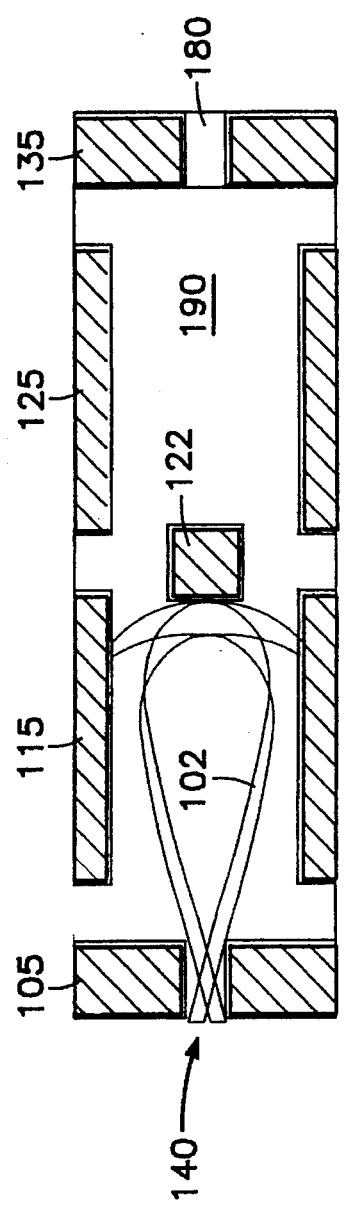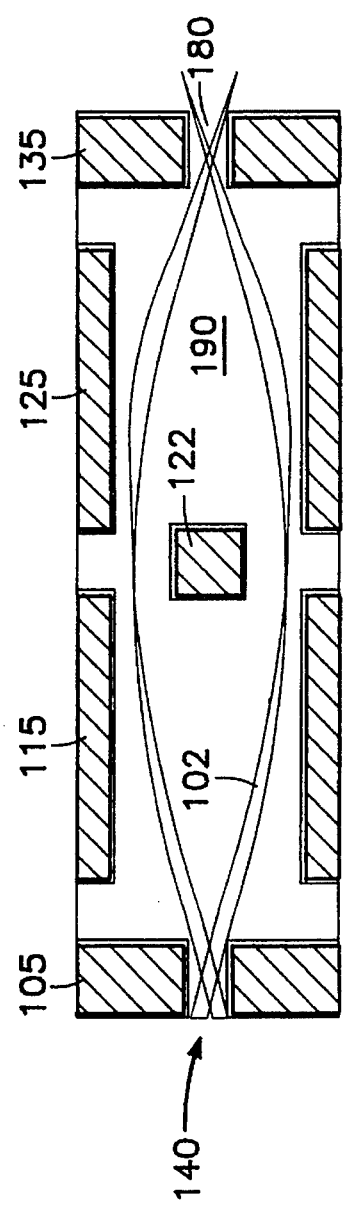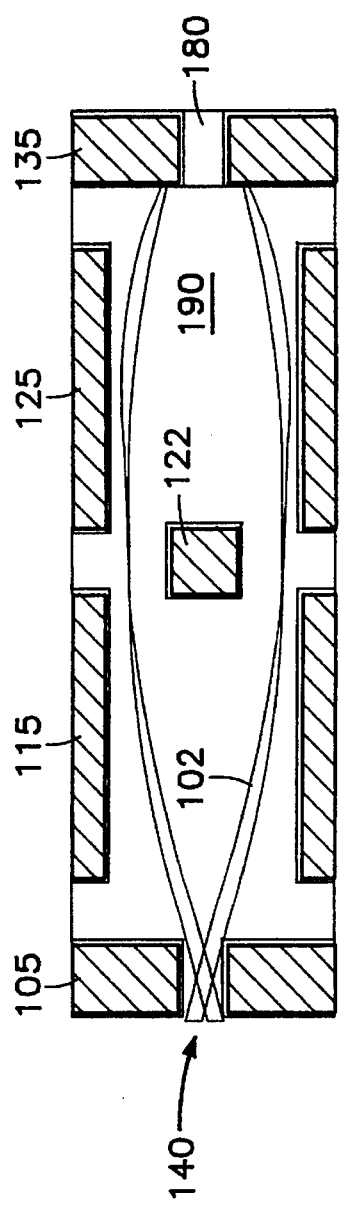

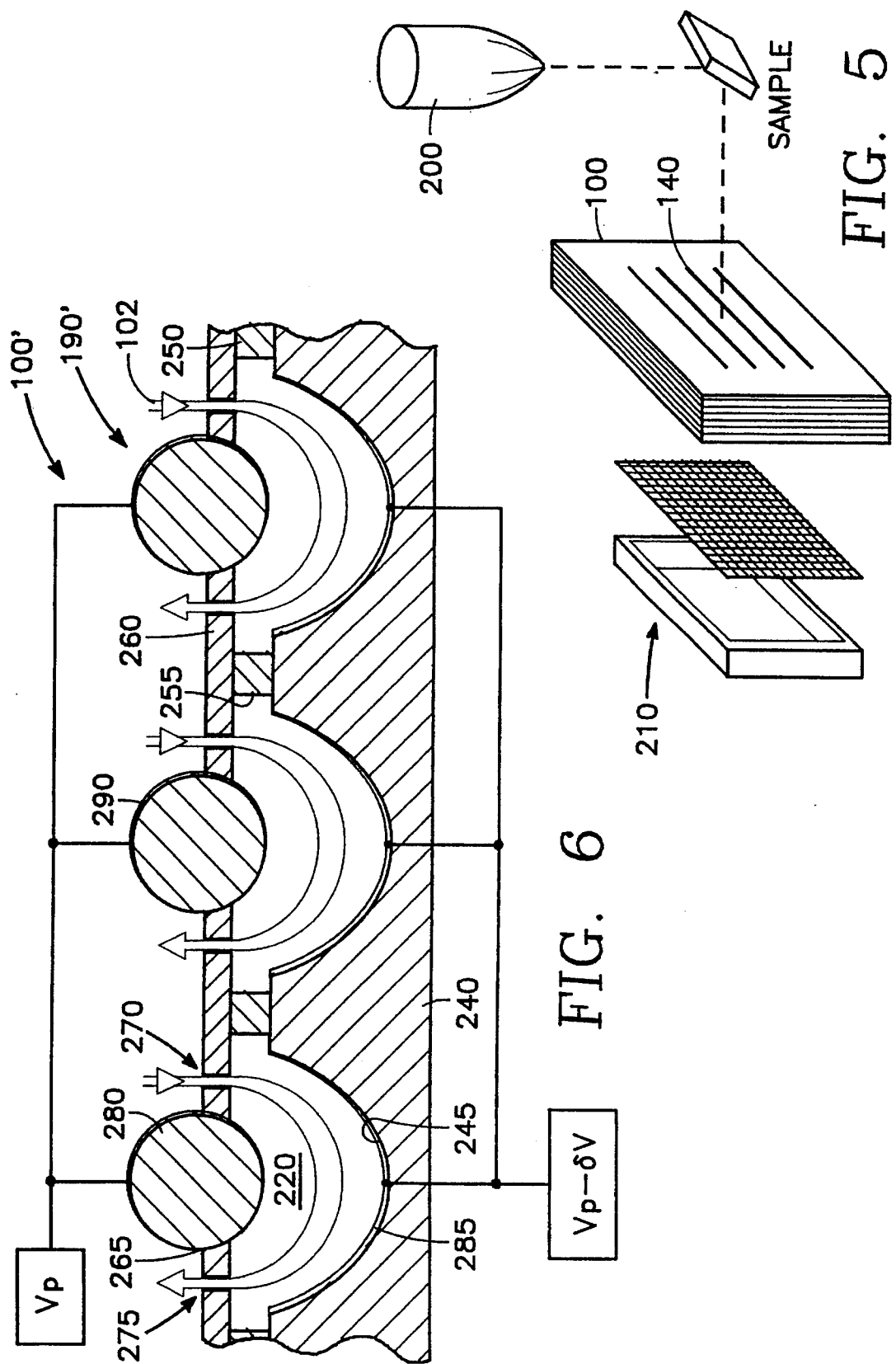

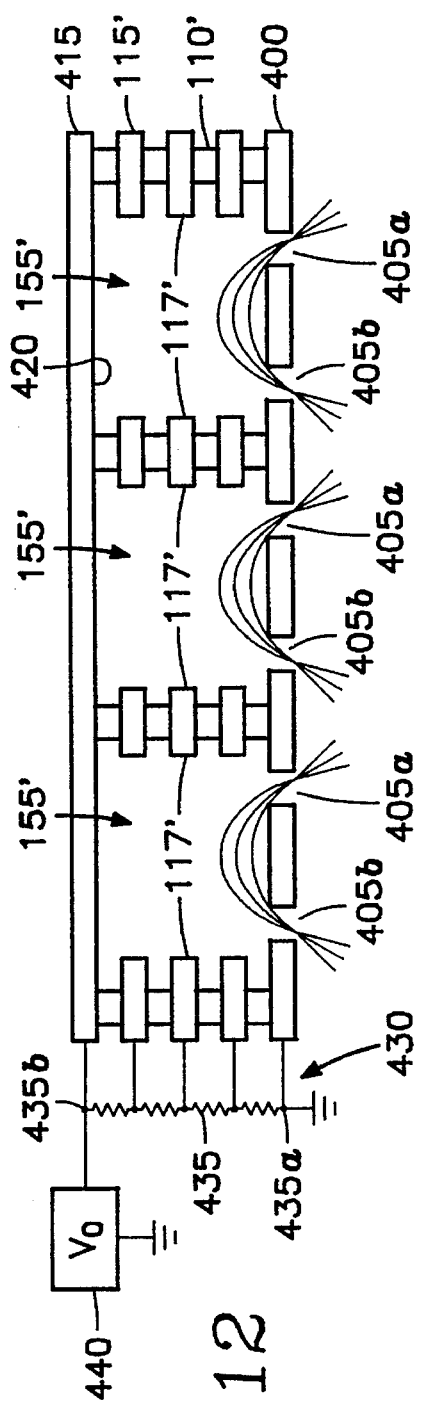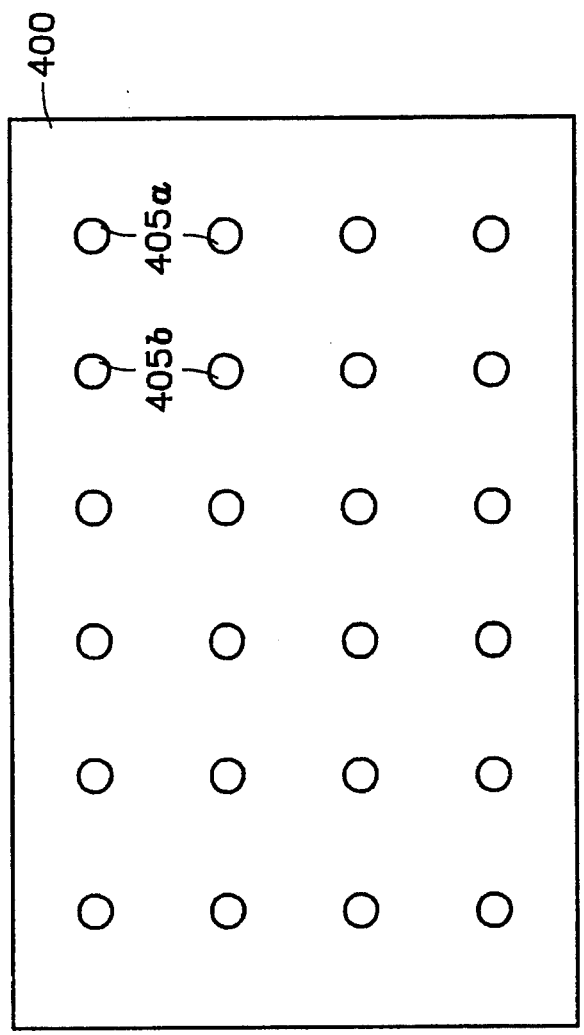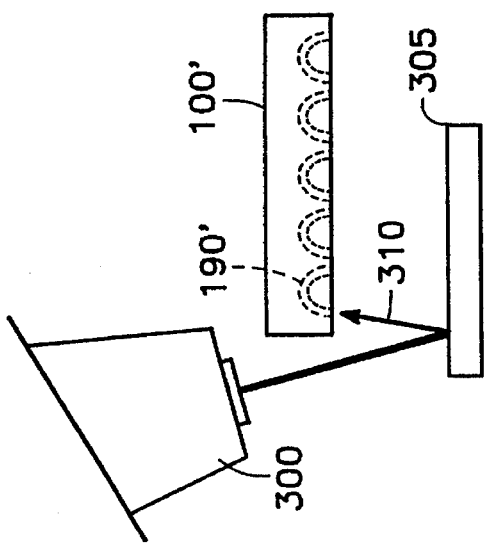

5,486,697

ARRAY OF MICRO-MACHINED MASS ENERGY MICRO-FILTERS FOR CHARGED PARTICLES

ORIGIN OF THE INVENTION

The invention described herein was made in the performance of work under a NASA contract, and is subject to the provisions of Public Law 96-517 (35 USC 202) in which the Contractor has elected to retain title.

BACKGROUND OF THE INVENTION

1. Technical Field

The invention is related to electrostatic lenses or mass energy filters for charged particles of the type employed in laboratory instruments for surface analysis, such as electron microscopes and spectrometers, employed on spacecraft for analyzing charged particles, for example.

2. Background Art

Electrostatic lenses for charged particle optics are usually bulky but of fairly simple shape and that have to be machined with stringent tolerances. Fundamental limitations such as spherical aberrations result in lens diameters much larger than the useful beam width, particularly, for example, in electron microscopy. There are, however, a number of applications where the size of electrostatic lenses could be reduced significantly without loss of performance. One area of special interest is the mass and energy detection of ions and electrons. In the general context of building more compact laboratory instruments or of building smaller scientific payloads for spacecraft, the reduction of mass, volume and power is greatly needed. However, the signal level of microscopes, telescopes and detectors is usually proportional to the acceptance area of the instrument and hence it is desireable to have the acceptance area large in order to collect as much signal as possible.

OBJECTS OF THE INVENTION

It is recognized in the present invention that by reducing the linear dimensions of the instrument by a factor of n, the volume and mass scale down as $n^3$. However, the acceptance area or aperture of the instrument scales down as $n^2$ and thus a scaled-down instrument collects n times more signal per unit mass or unit volume. It is further recognized in the present invention that the signal level of a large (unscaled-down) instrument may be replicated by employing a two-dimensional array of $n^2$ scaled-down instruments. Such an array has the same total acceptance area or aperture of an unscaled instrument but its mass and volume would be n times less, a significant advantage.

SUMMARY OF THE DISCLOSURE

An energy filter for charged particles includes a stack of micro-machined wafers including plural apertures passing through the stack of wafers, focusing electrodes bounding charged particle paths through the apertures, an entrance orifice to each of the plural apertures and an exit orifice from each of the plural apertures and apparatus for biasing the focusing electrodes with an electrostatic potential corresponding to an energy pass band of the filter. In one embodiment, the stack of micro-machined wafers further includes a deflection electrode blocking a central portion of each of the apertures and the filter further includes apparatus for biasing the deflection electrode with an electrostatic potential. The apparatus for biasing the deflection electrode and the apparatus for biasing the focusing electrodes may employ the same electrostatic potential, the filter further including apparatus for biasing the orifices with a different electrostatic potential. Preferably, the focusing electrodes include surfaces of intermediate ones of the wafers in the stack formed by the apertures and wherein the entrance and exit orifices include passages through top and bottom ones of the wafers in the stack, respectively. The deflection electrodes include elongate portions of another intermediate one of the wafers in the stack spanning respective ones of the apertures. The apertures may be rectangular and the elongate portions span the long sides of the apertures.

BRIEF DESCRIPTION OF THE DRAWINGS

FIGS. 2, 3 and 4 illustrated particle flux fields through the apparatus of FIG. 1 for the case in which the particle energy is, respectively, below, within and above the energy band of admittance.

FIG. 5 is a simplified block diagram of an instrumentation system employing the embodiment of FIG. 1.

FIG. 6 is a cross-sectional side view of a second embodiment of the invention.

FIG. 11 is a block diagram of an instrumentation system employing the embodiment of FIG. 7.

FIG. 12 is a cross-sectional side view of a third embodiment of the invention.

FIG. 13 is a top view of the embodiment of FIG. 12.

DETAILED DESCRIPTION OF THE PREFERRED EMBODIMENTS

Figure 1:
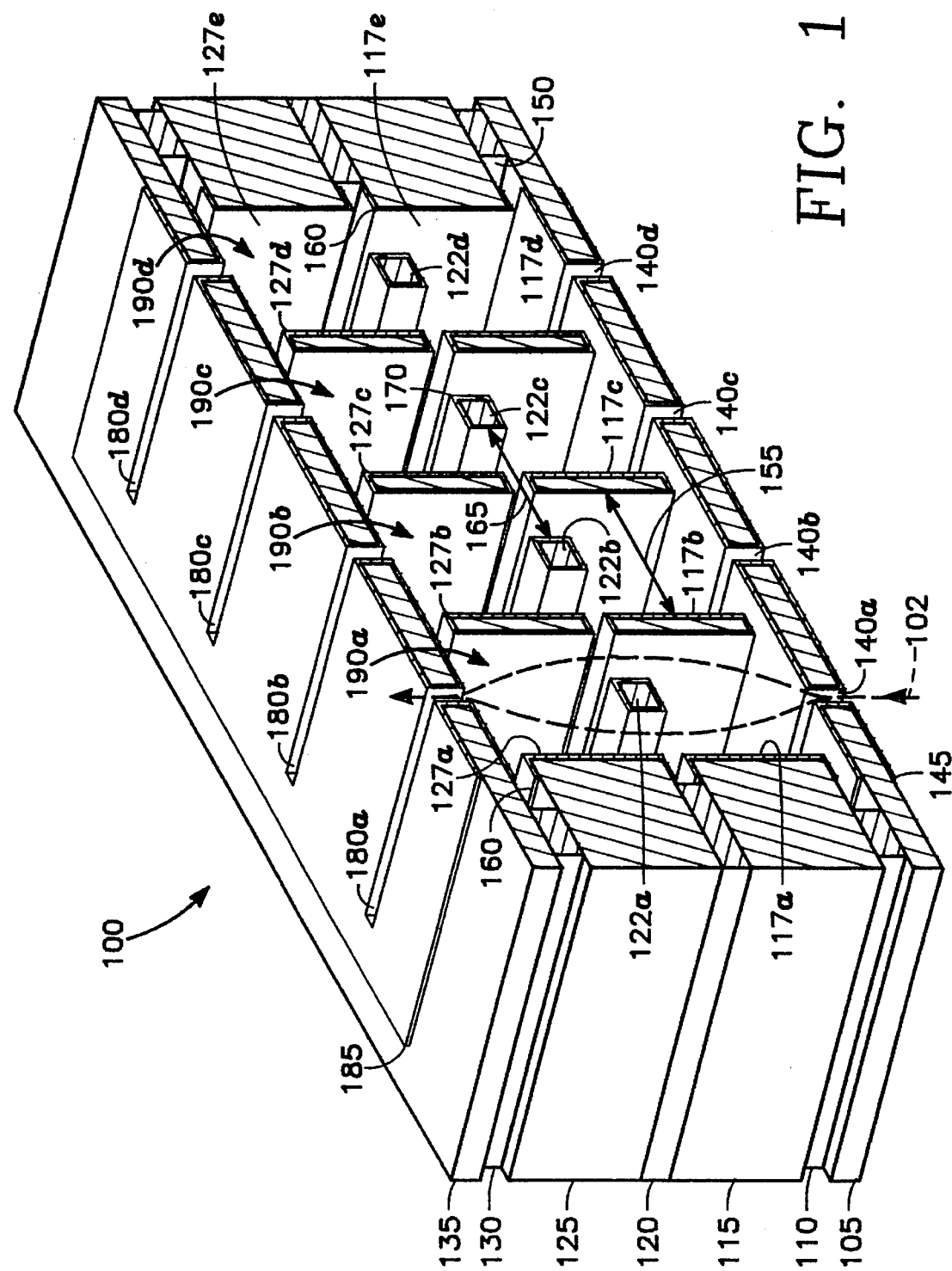
FIG. 1 is a perspective view of a first embodiment of the invention.

Referring to the embodiment of FIG. 1, an array of micro-machined mass energy filters for filtering charged particles 102 consists of a stack 100 of seven (10 cm diameter) 0.8 mm thick crystalline wafers 105–135. The wafers may be industry standard silicon <110> wafers, for example. The base wafer 105 has plural rectangular entrance slit apertures 140a–140d micro-machined therethrough with a width of about 0.1 mm and length of about 5 cm, the spacing between adjacent apertures being about 0.8 mm. A thin conductive film 145 is deposited or evaporated onto all surfaces of the base wafer near the apertures 140a–140d as shown in FIG. 1. The wafer 110 overlying the base wafer 105 is a insulating spacer covered with a 1-micron layer of silicon dioxide and has a large aperture 150 of about 80 percent of the wafer diameter, e.g., micro-machined therethrough. The wafer 115 overlying the spacer wafer 110 provides plural focusing electrodes 117a–117e formed by plural 4.0 cm-wide and 6 cm-long rectangular apertures 155a–155d micro-machined through the wafer 115 and centered over respective ones of the entrance apertures 140a–140b in the base wafer 105. A thin conductive film 160 is deposited or evaporated onto all surfaces of the wafer 115 near the apertures 155a–155d as shown in FIG. 1. The middle wafer 120 provides plural 2.0 cm-wide and 6 cm-long rectangular deflection electrodes 122a–122d centered over respective ones of the apertures 155a–155d and formed by rectangular apertures 165 micro-machined through the middle wafer 120. A thin conductive film 170 is deposited or evaporated onto all surfaces of each deflection electrode 122a–122d. The wafer 125 overlying the middle wafer 120 provides plural focus electrodes 127a–127e and is identical in structure with the focus electrode layer 115 described above. The wafer 130 overlying the focus electrode wafer 125 is a spacer and is identical in structure with the spacer wafer 110 described above. The top wafer 135 provides rectangular exit slit apertures 180a–180d and is identical in structure with the bottom wafer 105. A conductive layer 185 is deposited or evaporated onto all surfaces of the top electrode 135 near the exit apertures 180a–180d.

The resulting structure 100 is a linear array of microfilters 190a–190d, each filter 190 consisting of an entrance aperture 140, a lower focusing electrode 117, a deflection electrode 122, an upper focusing electrode 127 and an exit aperture 180 in co-axial alignment. A potential $V_p$ is applied to each of the focusing electrodes 117, 127, to each of the deflection electrodes 122 and to the conductive layers 145, 185 near the entrance and exit apertures 140, 180. In addition, a potential of $-\delta V$ is applied to only the conductive layers 145, 185 near the entrance and exit apertures 140, 180.

FIG. 1 illustrates how a beam of charged particles 102 of a certain uniform energy and mass incident on each entrance aperture 140 is directed through each filter 190 to exit at each exit aperture 180. FIG. 2 shows how a beam of energy less than the least pass band energy is prevented by the deflection electrode 122 from reaching the exit aperture 180. FIG. 3 illustrates how a beam of the correct energy reaches the exit aperture 180. FIG. 4 illustrates how a beam of energy in excess of the maximum pass band energy is deflected by the deflection electrode 122 from reaching the exit aperture 180. The location of the energy pass band of the filter scales with the applied voltage $V_p$. The width of the pass band scales with the voltage $-\delta V$. For $V_p = -100$ volts and $\delta V = -90$ volts, the selected energy band at which particles exit as shown in FIG. 3 is centered at about 101.4 eV. FIG. 2 corresponds to a particle energy of 100.1 eV and FIG. 4 corresponds to a particle energy of 102.7 eV. The selected energy scales as $V_p$. The filter may be operated at 0.006 milliTorr. FIG. 5 illustrates how the array filter of 100 of FIG. 1 is employed to filter electrons from a thermionic triode electron source 200 and detected by a secondary electron detector 210.

Figure 7:
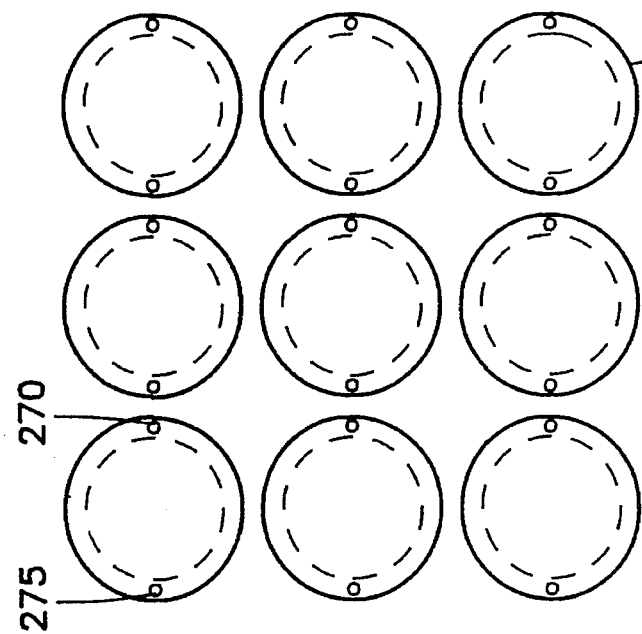
FIG. 7 is a top view of one version of the embodiment of FIG. 6.
Figure 8:
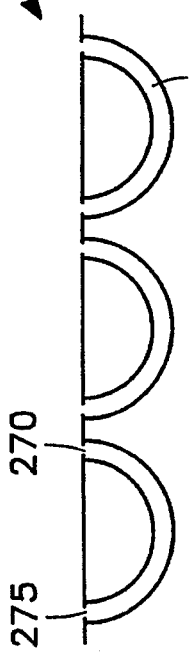
FIG. 8 is a side view corresponding to FIG. 7.

FIGS. 6, 7 and 8 illustrate another embodiment of the invention in which each filter 190' in an array 100' provides a curved or half-circular channel 220 between entrance and exit apertures 270, 275, the channel being sufficiently narrow to pass particles 102 within a narrow energy band from the entrance aperture 270 to the exit aperture 275. The channel 220 is formed by a base wafer 240 having a hemispherical void 245 micromachined therein at each filter 190'. A spacer wafer 250 overlies the base wafer 240 and has a circular aperture 255 micro-machined therethrough and centered over each hemispherical void 245. A top wafer 260 has ball-receiving hole 265 micro-machined therethrough over each hemispherical void 245 and an entrance aperture 270 and exit aperture 275 micro-machined therethrough on each side of the ball-receiving hole 265. A ball 280, such as a sapphire ball formed using conventional techniques, has a diameter at least slightly larger than the diameter of the ball-receiving hole 265 and rests in the hole 265 so as to be supported by the top wafer 260. The surface of the hemispherical hole 245 is coated with a thin conductive layer 285 and the ball 280 is coated with a thin conductive layer 290. The surface of the ball 280 is held at a potential $V_p$ while the surface of the hemispherical void 245 is held at a potential $V_p - \delta V$, and the energy band of particles 102 passing through the entrance aperture 270 which are admitted through the exit aperture is selected by adjusting these voltages.

Figure 9:
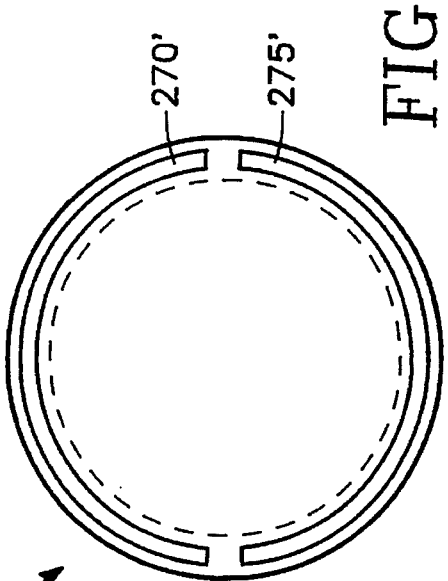
FIG. 9 is a top view of a second version of the embodiment of FIG. 7.
Figure 10:
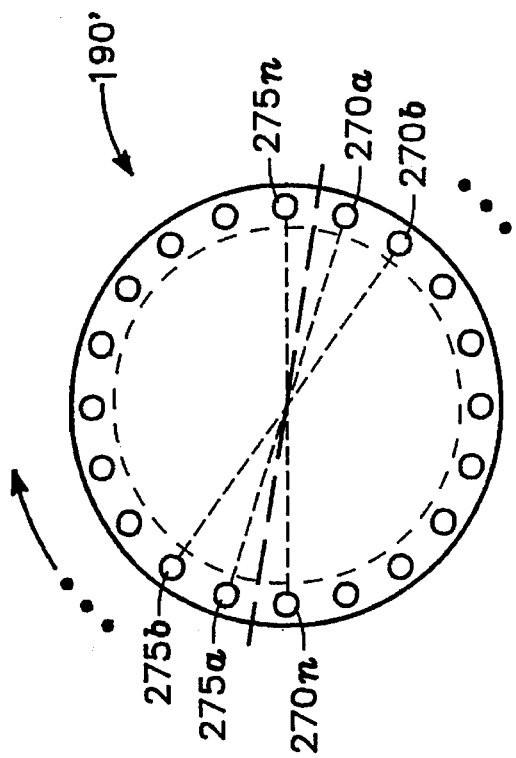
FIG. 10 is a top view of a third version of the embodiment of FIG. 7.

While the embodiment of FIG. 6 may have a single pair of entrance/exit apertures 270, 275, the embodiment of FIG. 9 has many such pairs 270a–n, 275a–n symmetrically disposed around the circumference of the filter 190'. In FIG. 10, the pair of apertures 270', 275' are annular. FIG. 11 illustrates an instrument for performing surface analysis using the array 100' of hemispherical filters 190' of FIG. 6 using a primary electron gun 300 directed toward a sample 305, the array 100' receiving the Auger electron beam 310 stimulated by the primary electron gun 300.

FIGS. 12 and 13 illustrate another embodiment of the invention consisting of a bottom wafer 400 having gridded apertures 405 micro-machined therethrough. Overlying the bottom wafer is an alternating sequence of spacer wafers 110' and focus electrode wafers 115' corresponding to the spacer wafer 110 and focus electrode wafer 115 of FIG. 1. Each focus electrode wafer 115' of FIG. 12 provides an array of focus electrodes 117' separated by apertures 155' centered over respective pairs of the gridded apertures 405 of the same type employed in the embodiment of FIG. 1. A top wafer 415 overlies the assembly of FIG. 12 and provides a top electrode surface 420. The bottom wafer 400 is coated with a thin conductive film near each of the gridded apertures 405. Each of the focus electrodes 117' is coated with a thin conductive layer, as is the bottom surface 420 of the top electrode. For the detection of positive charge particles, a voltage divider network 430 consisting of a tapped resistor 435 grounded at one end 435a and connected to a positive voltage supply 440 at the other end 435b progressively biases successive layers of focus electrodes 117', the bottom wafer 400 being grounded and the successive layers of focus electrodes 117' being biases with progressively higher voltages while the top wafer 415 is connected to the highest voltage.

Each pair of gridded apertures 405 consists of an entrance aperture 405a and an exit aperture 405b. As illustrated in FIG. 12, particles lying within a narrow energy band entering through a given entrance aperture 405a are deflected by the electric field of the layered focus electrodes 117' back to the corresponding exit aperture 405b, particles outside of the energy band being deflected away from the exit aperture 405b and thereby being quenched inside the cavity of the filter.

A limitation of the micro-machined filter array of FIGS. 12 and 13 is that the incoming particles should be somehow directed to the entrance apertures only and that the filtered particles must be detected in the plane of the incoming particles or otherwise deflected prior to detection.

Figure 14:
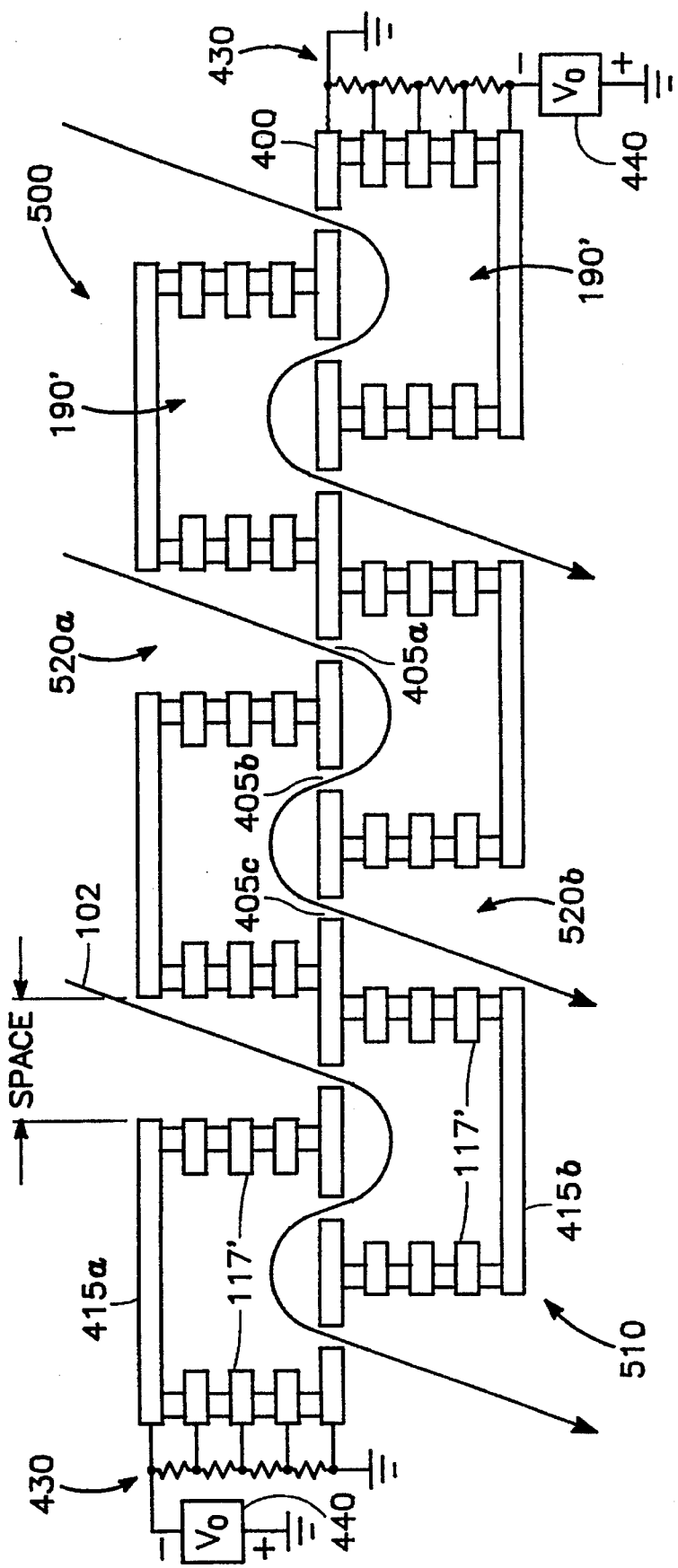
FIG. 14 is a side view of a fourth embodiment of the invention.

This limitation is overcome in the embodiment of FIG. 14 consisting of two filter arrays 500, 510, each array 500, 510 being identical in structure to the array of FIG. 12 except that the base wafer 400 is shared in common between the two arrays 500, 510 while the top wafer 415 of FIG. 12 is replaced by top wafers 415a, 415b having large apertures 520a, 520b, respectively. Moreover, the layers of focus electrodes 117' of the two arrays 500, 515 are slightly offset relative to one another as shown in FIG. 14 so that each cell 190' in each of the filter arrays 500, 510 shares one of its two gridded apertures 405 with a respective one of the cells 190' in the other one of the filter arrays 500, 510. Also, each cell 190' is separated by a space corresponding to an external aperture 520a, 520b, there being only one gridded aperture 405 in the common wafer 400 facing each external aperture 520a, 520b, each such gridded aperture being labelled 405a in FIG. 14. The gridded apertures 405a outside of the cells 190' are entrance apertures while each pair of gridded aperture 405 inside each cell 190' comprise a re-entrance aperture 405b and an exit aperture 405c. Thus, the sequence of cells and spaces in one filter array 500 is offset with the sequence of cells and spaces in the other filter array 510.

The stack 500 receives or collects incoming charged particles 102 at its input apertures 520a while the stack 510 emits filtered charged particles at its output apertures 520b.

As in the embodiment of FIG. 12, each focus electrode 117' of each wafer stack 500 or 510 is connected to a linear progression of voltages. For example, in order to filter negative charged particles, within each wafer stack 500, 510, those focus electrodes 117' furthest from the common backplane wafer 400 have lower (more negative) voltages while those closest to the backplane wafer 400 have higher (more positive) voltages. This progression may be reversed if it is desired to filter positively charge particles.

FIG. 14 shows how charged particles 102 lying within a narrow energy band entering any of the external apertures 520a of the filter array 500 and passing through the entrance apertures 405a are directed through the re-entrance apertures 405b and thence through the exit apertures 405c.

While the invention has been described in detail by specific reference to preferred embodiments, it is understood that variations and modifications thereof may be made without departing from the true spirit and scope of the invention.

What is claimed is:

1. An energy filter for charged particles comprising:
   (A) a stack of micro-machined wafers comprising:
      (1) plural apertures passing through said stack of wafers,
      (2) focusing electrodes bounding charged particle paths through said apertures,
      (3) an entrance orifice to each of said plural apertures and an exit orifice from each of said plural apertures; and
   (B) means for biasing said focusing electrodes with an electrostatic potential corresponding to an energy pass band of said filter.

2. The energy filter of claim 1 wherein:
   said stack of micro-machined wafers further comprises a deflection electrode blocking a central portion of each of said apertures; and
   said filter further comprises means for biasing said deflection electrode with an electrostatic potential.

3. The energy filter of claim 2 wherein said means for biasing said deflection electrode and said means for biasing said focusing electrodes employ the same electrostatic potential, said filter further comprising means for biasing said orifices with a different electrostatic potential.

4. The energy filter of claim 3 wherein said focusing electrodes comprise surfaces of intermediate ones of the wafers in said stack formed by said apertures and wherein said entrance and exit orifices comprise passages through top and bottom ones of the wafers in said stack, respectively.

5. The energy filter of claim 4 wherein said deflection electrodes comprise elongate portions of another intermediate one of said wafers in said stack spanning respective ones of said apertures.

6. The energy filter of claim 5 wherein said apertures are rectangular and said elongate portions span the long sides of said apertures.

7. The energy filter of claim 6 wherein said wafers comprise <110> silicon wafers.

8. The energy filter of claim 3 wherein said focusing electrodes comprise surfaces of intermediate ones of the wafers in said stack formed by said apertures and wherein said entrance and exit orifices comprise respective passages through a top one of the wafers in said stack.

9. The energy filter of claim 8 wherein said means for biasing said focusing electrodes comprises means for biasing successive wafers in said stack with successively higher voltages up to said bias voltage.

10. The energy filter of claim 9 wherein a bottom one of the wafers in said stack is an enclosure blocking one end of each of said apertures.

11. The energy filter of claim 1 wherein said stack of wafers comprises:
   a base wafer having plural curved voids therein and constituting said plural focusing lenses;
   a ball-receiving wafer having plural ball-receiving apertures therethrough in registration with said plural curved voids;
   said filter further comprising plural balls resting in said ball-receiving apertures; and
   wherein said entrance and exit orifices are in registration with opposite radii of a curved channel formed between each ball and each curved void.

12. The energy filter of claim 11 further comprising means for biasing said plural balls with an electrostatic potential.

13. The energy filter of claim 11 wherein said entrance and exit orifices are holes.

14. The energy filter of claim 13 wherein there are plural entrance and exit orifices surrounding a circumference of said channel.

15. The energy filter of claim 11 wherein there is one entrance orifice and one exit orifice for each channel.

16. The energy filter of claim 15 wherein said entrance and exit orifices are each partial annular openings.

17. An energy filter for charged particles comprising:
   (A) a back-to-back pair of stacks of micro-machined wafers, each of said stacks comprising:
      (1) a backplane wafer shared in common by said pair of stacks,
      (2) plural apertures through intermediate ones of said wafers overlying said backplane wafer,
      (3) focusing electrodes bounding charged particle paths through said alternate ones of said plural apertures,
      (4) a top wafer overlying said intermediate ones of said wafers, said top wafer closing said alternate ones of said plural apertures, said top wafer having windows therein exposing remaining ones of said plural apertures,
      (5) an entrance orifice through said backplane wafer to each of said alternate ones of said plural apertures and an exit orifice through said backplane wafer from each of said alternate ones of said plural apertures,
      (6) an exposed orifice through said backplane wafer from each of said remaining ones of said apertures;
   (B) means for biasing said focusing electrodes with an electrostatic potential corresponding to an energy pass band of said filter; and (C) wherein said pair of stacks are mutually offset so that an exposed orifice of a remaining one of said apertures of one of said stacks is an entrance orifice of an alternate one of the other of said stacks and an exit orifice of an alternate one of said apertures of said one stack is an exposed orifice of a remaining one of said apertures of the other stack.

18. The filter of claim 17 wherein said means for biasing comprise means for imposing a progression of voltages on successive ones of said focusing electrodes in said each of said stacks of wafers.

* * * * *